United States Patent
Moriya et al.

(10) Patent No.: US 7,294,566 B2
(45) Date of Patent: Nov. 13, 2007

(54) METHOD FOR FORMING WIRING PATTERN, METHOD FOR MANUFACTURING DEVICE, DEVICE, ELECTRO-OPTIC APPARATUS, AND ELECTRONIC EQUIPMENT

(75) Inventors: Katsuyuki Moriya, Azumino (JP); Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 89 days.

(21) Appl. No.: 11/250,370

(22) Filed: Oct. 17, 2005

(65) Prior Publication Data

US 2006/0110908 A1    May 25, 2006

(30) Foreign Application Priority Data

Nov. 19, 2004    (JP) ............... 2004-335590

(51) Int. Cl.
*H01L 21/44*    (2006.01)
(52) U.S. Cl. ............... 438/617; 438/30; 438/75; 438/142; 438/149; 257/E21.017; 257/E21.221; 257/E21.219; 257/E21.223

(58) Field of Classification Search ........... 438/617, 438/30, 70, 75, 121, 122, 149, 513, 257, 438/614, 674, 683, 685, 686, 680, 678, 725
See application file for complete search history.

(56) References Cited

U.S. PATENT DOCUMENTS

| | | | |
|---|---|---|---|
| 5,132,248 A | 7/1992 | Drummond et al. | 438/30 |
| 7,070,701 B2* | 7/2006 | Takagi et al. | 216/41 |
| 7,101,013 B2* | 9/2006 | Nakamura | 347/19 |
| 7,150,898 B2* | 12/2006 | Miura | 427/421.1 |
| 7,172,912 B2* | 2/2007 | Toyoda | 438/30 |
| 2004/0239853 A1* | 12/2004 | Sakurada | 349/122 |

* cited by examiner

*Primary Examiner*—David Nhu
(74) *Attorney, Agent, or Firm*—Oliff & Berridge, PLC

(57) ABSTRACT

A method for forming a wiring pattern according to an aspect of the invention forms a wiring pattern in a certain area on a substrate by using a droplet discharge technique, and includes forming a bank surrounding the certain area on the substrate; discharging a first functional liquid containing a material of the wiring pattern to an area surrounded by the bank to form a first wiring pattern; discharging a second functional liquid onto the first wiring pattern to form a second wiring pattern; and collectively baking the wiring pattern of a plurality of layers including the first wiring pattern and the second wiring pattern.

7 Claims, 12 Drawing Sheets

METHOD FOR FORMING WIRING PATTERN, METHOD FOR MANUFACTURING DEVICE, DEVICE, ELECTRO-OPTIC APPARATUS, AND ELECTRONIC EQUIPMENT

BACKGROUND OF THE INVENTION

1. Technical Field

This application claims the benefit of Japanese Patent Application No. 2004-335590, filed Nov. 19, 2004. The entire disclosure of the prior application is hereby incorporated by reference herein in its entirety.

This invention relates to a method for forming a wiring pattern, a method for manufacturing a device, a device, an electro-optic apparatus, and electronic equipment.

2. Related Art

A photolithography method, for example, is used for manufacturing a device including wiring in use for electronic circuits or integrated circuits. In the photolithography method, a photosensitive material called a resist is applied to a substrate on which a conducting film is formed beforehand, a circuit pattern is irradiated with light for exposure and development, a conducting film is etched in accordance with the resist pattern, and as a result, a wiring pattern of a thin film is formed. The photolithography method requires large-scale equipment such as a vacuum device and complicated processes, and also has a material use efficiency of about several percent such that most of materials have to be discarded, thereby leading to high manufacturing costs.

A method of forming a line pattern on a substrate by using a droplet discharge technique in which a functional liquid, which is a liquid material, is discharged in a droplet from a droplet discharge head is proposed, for example, as disclosed in U.S. Pat. No. 5,132,248, which is an example of related art. In this method, a functional liquid for wiring pattern in which conductive fine particles such as metal fine particles are dispersed is placed directly in an area of the substrate in which a pattern is to be formed, and then is transformed to a conducting film pattern constituting a thin film by heat treatment or laser irradiation. This method has the following merits: a photolithography process becomes unnecessary; processes are substantially simplified; and a small amount of material is needed (see the related art example mentioned above, for example).

If a wiring pattern in which a plurality of materials are layered is formed by using the former wiring pattern formation method described above, for example, if a wiring pattern of a layered film with a two-layer structure is manufactured by using two kinds of material, a first functional liquid is placed and then baked so that a wiring pattern as a first layer (hereinafter referred to as a first layer wiring pattern) is obtained. Subsequently, a second functional liquid is placed on the first layer wiring pattern and then baked so that a second layer wiring pattern is obtained. Thus, the wiring pattern of a layered film with a two-layer structure has been formed. In this method, when the second layer wiring pattern is baked, the first layer wiring pattern is also baked. Namely, there is a difference in the hysteresis of heating between the first layer wiring pattern and the second layer wiring pattern. Avoid tends to occur inside the first layer wiring pattern due to the difference in the hysteresis of heating. Metal particles do not grow evenly because of the influence of the void, and as a result, the first layer wiring pattern is uneven. Affected by the unevenness, the layered film obtained after baking the second layer wiring pattern has the irregular thickness, and therefore securing flatness of the wiring pattern in the layered film is not enabled. The film has the possibility that quality problems such as a crack and a breakage will occur. If the wiring pattern of a layered film with a three-layer structure is formed by using three kinds of material, the similar tendency is acknowledged. As a result, the layered film with a three-layer structure has the irregular thickness, and securing flatness of the wiring pattern is more difficult. In summary, the more the number of layers of the film increases, the more the irregularity of the film thickness of the layered film increases.

SUMMARY

An advantage of an exemplary aspect of the invention is to provide a method for forming a wiring pattern, a method for manufacturing a device, a device, an electro-optic apparatus, and electronic equipment that can reduce quality problems such as a crack and a breakage when a wiring pattern is formed by depositing a plurality of materials to be layered.

The method for forming a wiring pattern according to an exemplary aspect of the invention forms a wiring pattern in a certain area on a substrate by using a droplet discharge technique, and includes forming a bank surrounding the certain area on the substrate; discharging a first functional liquid containing a material of the wiring pattern to an area surrounded by the bank to form a first wiring pattern; discharging a second functional liquid onto the first wiring pattern to form a second wiring pattern; and collectively baling the wiring pattern of a plurality of layers including the first wiring pattern and the second wiring pattern.

According to this method, the first functional liquid and the second functional liquid are applied to a certain area zoned by the bank to form the first wiring pattern and the second wiring pattern. A wiring pattern in which these functional liquids are layered is collectively and simultaneously baked. Heating is completed one time, thereby enabling the operations to be simplified. The occurrence of a void can be controlled by collectively baling, and therefore when metal particles in layers grow, the particle growth can be uniformed. As a result, a film with little unevenness can be formed. The film with little unevenness improves the evenness of the film thickness of the layered film. The occurrence of quality problems such as a crack and a breakage is made difficult. If a multi-layered film with three or four layers is formed, a wiring pattern with a few problems such as a crack and a breakage can be formed.

It is preferable that, in the method for forming a wiring pattern according to an exemplary aspect of the invention, the forming a first wiring pattern include pre-baling the first wiring pattern after discharging the first functional liquid; and, in the forming a second wiring pattern, the second functional liquid is discharged onto the first wiring pattern pre-baked to form the second wiring pattern.

According to this method, since a step of pre-baking is placed after discharging the first functional liquid, the first wiring pattern is solidified to some extent. The first wiring pattern is already solidified to some extent when the second functional liquid is discharged to form a layered film. This makes it difficult to mix the first functional liquid and the second functional liquid.

It is preferable that, in the method for forming a wiring pattern according to an exemplary aspect of the invention, the forming a second wiring pattern comprise imparting lyophobicity to the bank before discharging the second functional liquid.

When a dispersion medium contained in the functional liquid evaporates by intermediate drying, the surface of the bank B is also dried. Lyophobicity of the surface of the bank B tends to decrease. However, by a step of imparting lyophobicity to the bank, lyophobicity of the surface of the bank B can be restored to the original state. If lyophobicity of the bank can be restored, a functional liquid is repelled by the bank to be easily contained in an area surrounded by the bank even if the functional liquid larger than the area surrounded by the bank lands in the area in writing a pattern. Accordingly, the functional liquid precisely fills the area surrounded by the bank. As a result, a wiring pattern with little unevenness can be formed.

It is preferable that the method for forming a wiring pattern according to an exemplary aspect of the invention further include discharging a third functional liquid onto the second wiring pattern to form a third wiring pattern, after the forming a second wiring pattern and before the collectively baking, wherein in the collectively baking the wiring pattern of a plurality of layers, a substrate layer as the first wiring pattern, a conducting layer as the second wiring pattern, and a diffusion barrier layer as the third wiring pattern are collectively baked.

According to this method, three-layered wiring pattern having a substrate layer, a conducting layer, and a diffusion barrier layer can be formed readily. In addition, since quality problems such as a breakage are reduced, the wiring pattern with little degradation of performance can be formed. The substrate layer formed on the substrate can enhances adhesion between the substrate and the conducting layer, making the breakage of layers difficult. The conducting layer with conductivity can be energized, and therefore can be used as circuit wiring, enabling various devices to be manufactured. Because the diffusion barrier layer is formed on the conducting layer, problems such as performance degradation caused by the diffusion of the conducting layer to an insulating film can be reduced.

A method for manufacturing a device according to an exemplary aspect of the invention has a wiring pattern formed on a certain area on a substrate by using a droplet discharge technique, wherein the wiring pattern is formed on the substrate by using the foregoing method for forming a wiring pattern.

According to this method, the wiring pattern with little unevenness can be formed as described above, a device with a few problems such as a crack and a breakage can be formed. For example, a device having a wiring pattern such as a switching element can be manufactured readily.

It is preferable that, in the method for manufacturing a device according to an exemplary aspect of the invention, at least one of a gate electrode and gate wiring be formed as the wiring pattern on the substrate.

According to this method, the gate electrode, gate wiring, and the like with a few problems such as a crack and a breakage can be formed. For example, a TFT device on which a gate electrode, gate wiring, and the like are formed can be provided.

It is preferable that, in the method for manufacturing a device according to an exemplary aspect of the invention, at least one of a source electrode and source wiring be formed as the wiring pattern on the substrate.

According to this method, the source electrode, source wiring, and the like with a few problems such as a crack and a breakage can be formed. For example, a TFT device on which a source electrode, source wiring, and the like are formed can be provided.

A device according to an exemplary aspect of the invention is formed by using the foregoing method for manufacturing a device.

According to this device, the foregoing quality problems such as a crack and a breakage can be reduced and a more precise device can be provided.

An electro-optic apparatus according to an exemplary aspect of the invention comprises the foregoing device.

In this case, because the apparatus includes the device capable of reducing quality problems such as a crack and a breakage, an electro-optic apparatus with little degradation of performance due to a crack, a breakage, and the like as well as high reliability can be provided.

Electronic equipment according to an exemplary aspect of the invention comprises the foregoing electro-optic apparatus.

In this case, because the equipment includes the electro-optic apparatus with little degradation of performance due to a crack, a breakage, and the like as well as high reliability, miniaturizable electronic equipment with high reliability can be provided.

BRIEF DESCRIPTION OF THE DRAWINGS

The invention will be described with reference to the accompanying drawings, wherein like reference numerals refer to like elements, and wherein.

DESCRIPTION OF THE EMBODIMENTS

Figure 1:
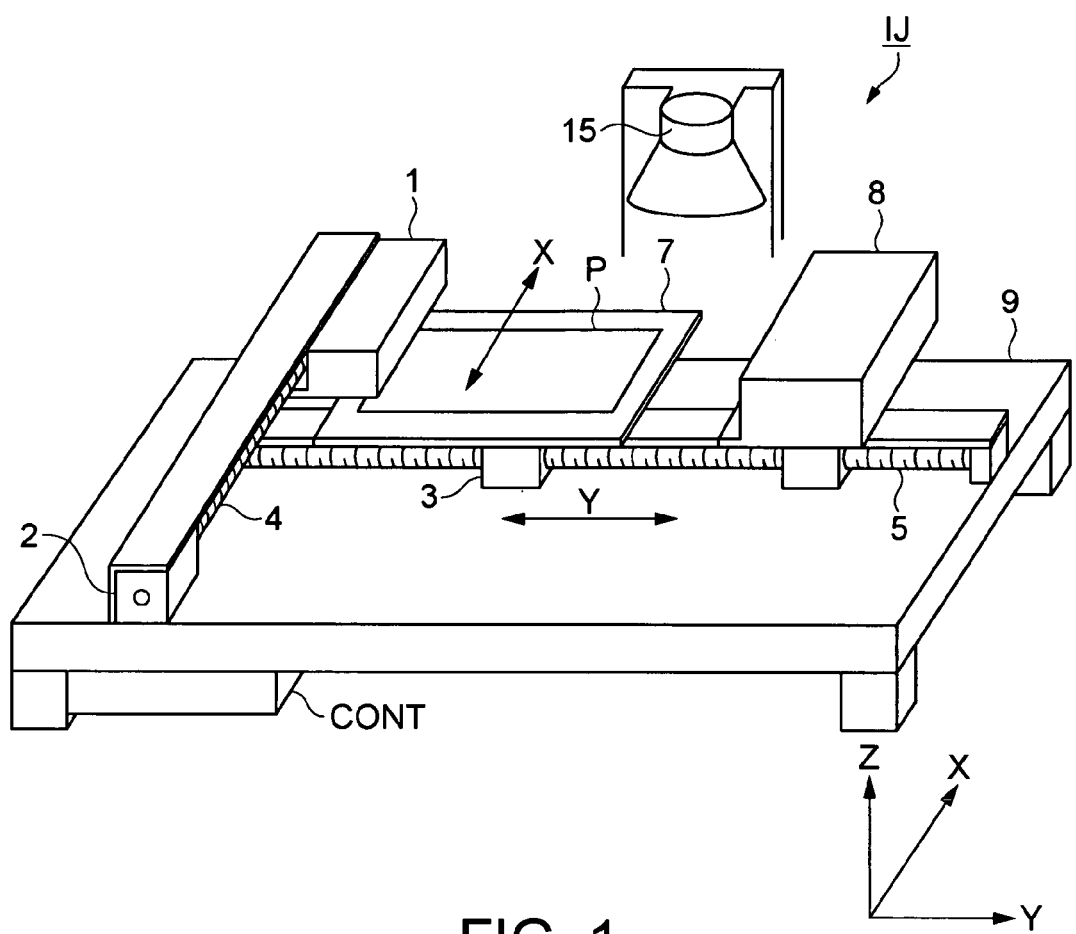
FIG. 1 is a perspective view showing the schematic structure of a droplet discharge device IJ of a first embodiment.

Embodiments will now be given for a wiring pattern formation method, a device manufacturing method, a device, an electro-optic apparatus, and electronic equipment of the invention, and will be described in detail with reference to the accompanying drawings.

First Embodiment

In the embodiment, an example in which a functional liquid for wiring pattern (hereinafter referred to as a wiring pattern functional liquid) X including conductive fine particles is discharged in a droplet from a discharge nozzle of a droplet discharge head by the droplet discharge technique to form a wiring pattern including a plurality of conducting films between banks formed in accordance with the wiring pattern on the substrate. Before characteristic structure and methods of an exemplary aspect of the invention is described, a wiring pattern functional liquid, a substrate, a droplet discharge technique, and a droplet discharge device used for the droplet discharge technique will be described in sequence.

Wiring Pattern Functional Liquid

The wiring pattern functional liquid X is made of a dispersion liquid having conductive fine particles dispersed in a dispersion medium. In the embodiment, metal fine particles containing any one of gold, silver, copper, iron, chromium, manganese, molybdenum, titanium, palladium, tungsten, and nickel, their oxides, and fine particles of conductive polymer and superconductor are used as conductive fine particles. The conductive fine particles having the surface coated with an organic matter may be used in order to improve its dispersibility. It is preferable that the particle size of the conductive fine particles be not less than 1 nm nor greater than 0.1 μm. If the particle size is greater than 0.1 μm, the discharge nozzle of the droplet discharge head described later might be clogged. If the particle size is less than 1 nm, the volume ratio of a coating agent to conductive fine particles increases, and therefore the ratio of the organic matter in the film obtained becomes excessive.

The dispersion medium must be one by which the above conductive fine particles can be dispersed and cohesion is not caused, and there is no other particular restriction on the dispersion medium. For example, alcohol such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1,2-dimethoxyethane, bis(2-methoxyethyl)ether, and p-dioxane; and polar compounds such as propylene carbonate, γ-butyrolactone, N-methyl-2-pyrrolidone, dimethylformamide, dimethylsulfoxide, and cyclohexanone; other than water, may be mentioned. Among them, water, alcohol, hydrocarbon compounds, and ether compounds are preferable in regard to the dispersibility of fine particles and the stability of the dispersion liquid, as well as the ease of their application to the droplet discharge technique; water and hydrocarbon compounds may be mentioned as more preferable dispersion media.

It is preferable that the surface tension of the dispersion liquid containing the above conductive fine particles be within the range not less than 0.02 N/m nor more than 0.07 N/m. If the surface tension is less than 0.02 N/m when a liquid is discharged by the droplet discharge technique, the wettability of a functional liquid composition to the discharge nozzle surface increases and therefore the deflection is likely to occur, while if the wettability exceeds 0.07 N/m, the shape of meniscus at the end of the nozzle is not stable and therefore it is difficult to control the discharge amount and the discharge timing. In order to adjust the surface tension, it is recommended that a minute amount of fluorine-based, silicon-based, or nonion-based surface tension adjusting agent be added to the dispersion liquid mentioned above unless the contact angle to the substrate is largely reduced. The nonion-based surface tension adjusting agent makes the wettability to the substrate of the liquid better, improves the leveling of the film, and helps prevent minute unevenness of the film from occurring. The dispersion liquid mentioned above may include alcohol, ether, ester, ketone, and other organic compounds if necessary.

It is preferable that the dispersion liquid mentioned above have the viscosity not less than 1 mPa·s nor more than 50 mPa·s. If the viscosity is less than 1 mPa·s when a liquid material is discharged as a liquid droplet by the droplet discharge technique, the periphery of the discharge nozzle tends to be contaminated due to the outflow of a functional liquid, while if the viscosity is more than 50 mPa·s, the frequency of clogging in a nozzle hole increases, making it difficult to smoothly discharge a droplet.

Substrate

Glass, silica glass, an Si wafer, a plastic film, a metal plate, or other various types of substance may be used as the substrate on which a wiring pattern is formed. A deposit with a semiconductor film, a metal film, a insulating film, or an organic film formed as a substrate layer on the surface of the substrate formed of one of these materials may also be used.

Droplet Discharge Technique

Electrification control, pressure vibration, electromechanical conversion, electrothermal conversion, electrostatic suction and the like are included in discharge technique examples of the droplet discharge technique. In the electrification control, a charge is applied to a material by an electrification electrode, and the material is discharged from a discharge nozzle while the flying direction of the material is controlled by a deflecting electrode. In the pressure vibration, a ultrahigh pressure of about 30 kg/cm$_2$ is applied to a material so as to discharge the material at the end side of a discharge nozzle; if a control voltage is not applied, the material moves straight and is discharged from the nozzle, whereas if a control voltage is applied, electrostatic repulsion occurs in the material, and the material flies in all directions and is not discharged from the discharge nozzle. The electromechanical conversion utilizes the properties of a piezoelectric element that the piezoelectric element is deformed by a pulsed electrical signal. By the deformation of the piezoelectric element, a pressure is applied through a flexible substance to a space in which the material remains. The material is pushed out of the space, and is discharged from the discharge nozzle.

In the electrothermal conversion, a material is rapidly vaporized to create bubbles by a heater disposed in the space in which the material is reserved, and the material in the space is ejected by the pressure of the bubbles. In the electrostatic suction, a minute pressure is applied to the inside of the space in which the material is reserved to form a meniscus of the material at the discharge nozzle. In this state, electrostatic suction is applied to draw the material. Additionally, other techniques such as a technique of utilizing the change of a fluid by using the electric field and a technique of spiting a droplet by a spark are applicable. The droplet discharge technique has advantages in that it has little waste in material use and a desired amount of material can be precisely placed at a desired location. The weight of a drop of the liquid material discharged by the droplet discharge technique is, for example, 1 to 300 ng.

In the following, a device manufacturing apparatus used in manufacturing a device according to an exemplary aspect of the invention will be described. As the device manufacturing apparatus, a droplet discharge device, which manufactures a device by discharging (dropping) a droplet from the droplet discharge head onto a substrate, is used.

Droplet Discharge Device

FIG. 1 is a perspective view showing the schematic structure of a droplet discharge device IJ. The droplet discharge device IJ includes a droplet discharge head 1, an X-axis direction drive axis 4, a Y-axis direction guide axis 5, a control device CONT, a stage 7, a cleaning mechanism 8, a base 9, and a heater 15.

The stage 7 holds the substrate P on which a functional liquid is placed by the droplet discharge device IJ, and has a fixation mechanism, not shown, to fix the substrate P to a reference position.

The droplet discharge head 1 is a multi-nozzle type droplet discharge head with a plurality of discharge nozzles; its longitudinal direction corresponds to the X-axis direction. The plurality of discharge nozzles are disposed side by side in the X-axis direction on the undersurface of the droplet discharge head 1 at fixed intervals. From the discharge nozzles of the droplet discharge head 1, the functional liquid containing conductive fine particles described above is discharged onto the substrate P held by the stage 7.

An X-axis direction drive motor 2 is connected to the X-axis direction drive axis 4. The X-axis direction drive motor 2, which is a stepping motor or the like, rotates the X-axis direction drive axis 4 when a drive signal in the X-axis direction is supplied form the control device CONT. When the X-axis direction drive axis 4 is rotated, the droplet discharge head 1 moves in the X-axis direction.

The Y-axis direction guide axis 5 is fixed to the base 9 so as not to move. The stage 7 has a Y-axis direction drive motor 3. The Y-axis direction drive motor 3, which is a stepping motor or the like, moves the stage 7 in the Y-axis direction when a drive signal in the Y-axis direction is supplied from the control device CONT.

The control device CONT supplies a voltage for controlling the discharge of a droplet to the droplet discharge head 1. Furthermore, the control device CONT supplies to the X-axis direction drive motor 2 a drive pulse signal to control the movement of the droplet discharge head 1 in the X-axis direction, and also supplies to the Y-axis direction drive motor 3 a drive pulse signal to control the movement of the stage 7 in the Y-axis direction.

The cleaning mechanism 8 cleans the droplet discharge head 1, and has a Y-axis direction drive motor, which is not shown. By the drive of the Y-axis direction drive motor, the cleaning mechanism 8 moves along the Y-axis direction guide axis 5. The movement of the cleaning mechanism 8 is controlled by the control device CONT.

The heater 15, which is a means of heat-treating the substrate P by lamp annealing, vaporizes and dries a solvent included in a functional liquid applied onto the substrate P. Power on and off of the heater 15 is controlled by the control device CONT.

The droplet discharge device IJ discharges a droplet onto the substrate P while relatively scanning the droplet discharge head 1 and the stage 7 holding the substrate P. Hereinafter, the Y-axis direction refers to as the scan direction, and the X-axis direction, which is orthogonal to the Y-axis direction, refers to as the non-scan direction. Accordingly, the discharge nozzles of the droplet discharge head 1 are disposed side by side in the X-axis direction, which is the non-scan direction, at fixed intervals. The droplet discharge head 1 is disposed perpendicular to the direction of travel of the substrate P in FIG. 1, and may be disposed so as to intersect with the direction of travel of the substrate P by adjustment of the angle of the droplet discharge head 1. Thus, the adjustment of the angle of the droplet discharge head 1 enables the pitch between the nozzles. It is also permissible that the distance between the substrate P and the surface on which nozzles are disposed are arbitrarily adjustable.

Figure 2:
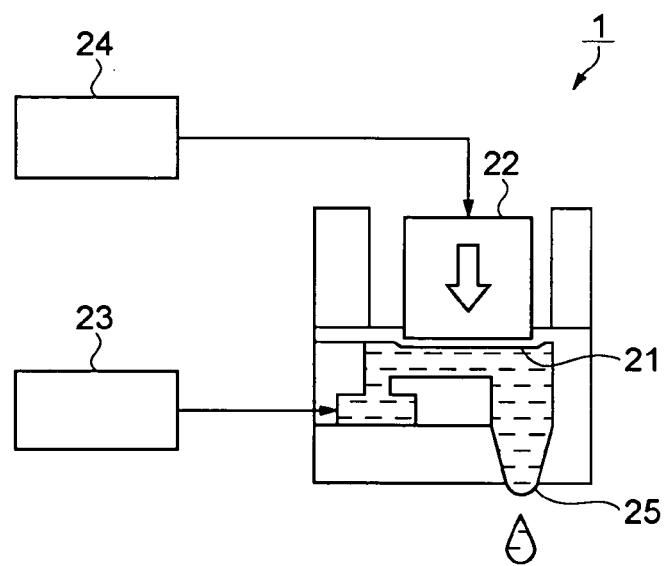
FIG. 2 is a schematic sectional view illustrating the discharging principle of a liquid material based on the piezoelectric method.

FIG. 2 is a view for illustrating the discharging principle of a liquid material based on the piezoelectric method. In FIG. 2, a piezoelectric element 22 is disposed adjacent to a liquid chamber 21 containing a liquid material (wiring pattern functional liquid X). A liquid material is supplied through a liquid material supply system 23 including a material tank that contains a liquid material to the liquid chamber 21. The piezoelectric element 22 is connected to a drive circuit 24, through which a voltage is applied to the piezoelectric element 22 to deform the piezoelectric element 22. By deforming the piezoelectric element, the liquid chamber 21 is deformed, so that the liquid material is discharged from a discharge nozzle 25 as a droplet L. In this case, by changing the value of the applied voltage, the amount of deformation of the piezoelectric element 22 is controlled. By changing the frequency of the applied voltage, the speed of deformation of the piezoelectric element 22 is controlled. Discharging a droplet by the piezoelectric method does not heat the material, and therefore has an advantage in that it is difficult to affect the composition of a material.

Figure 3:
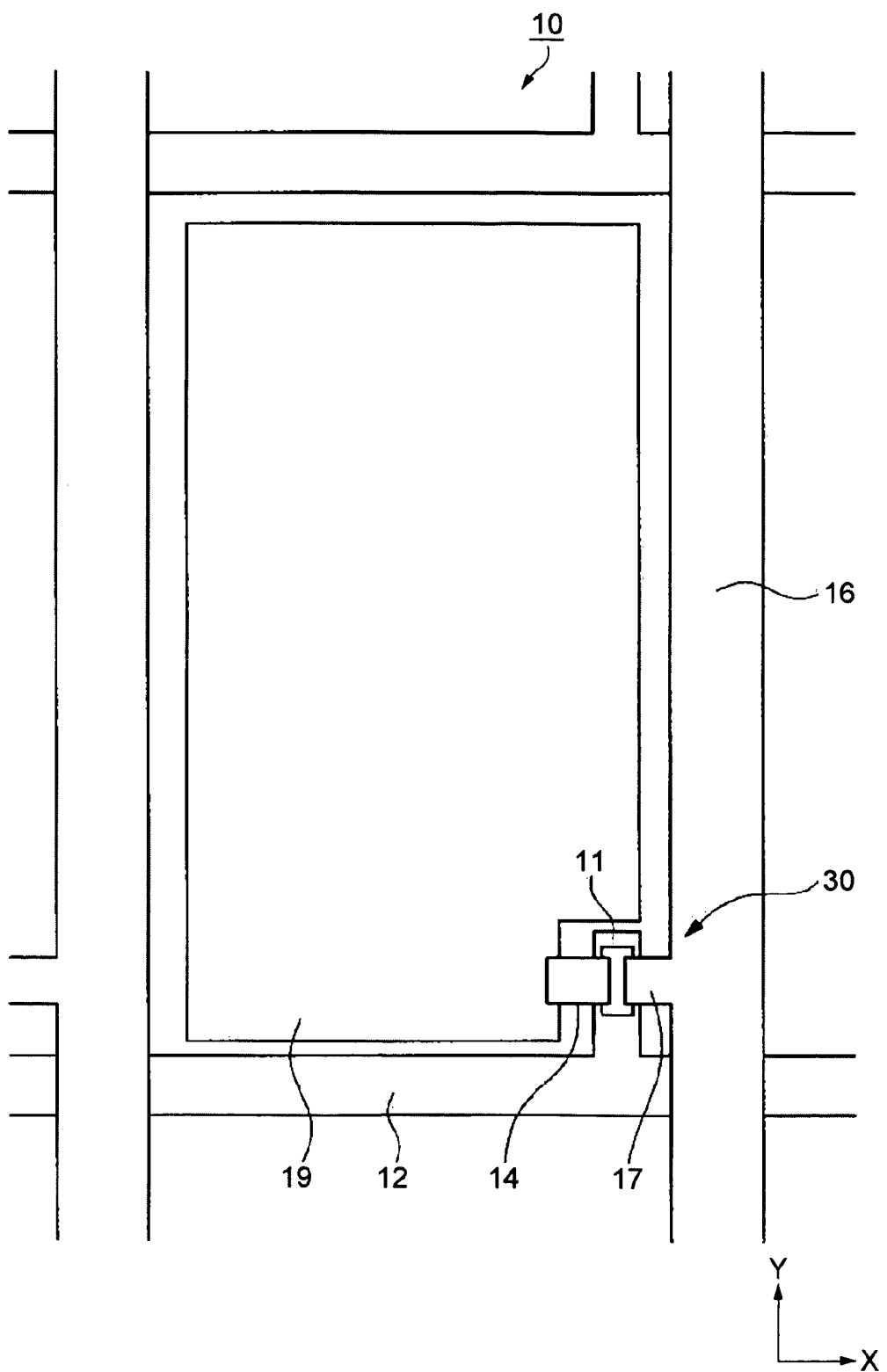
FIG. 3 is a plan view showing the schematic structure of a substantial part of a TFT array substrate.
Figure 4A:
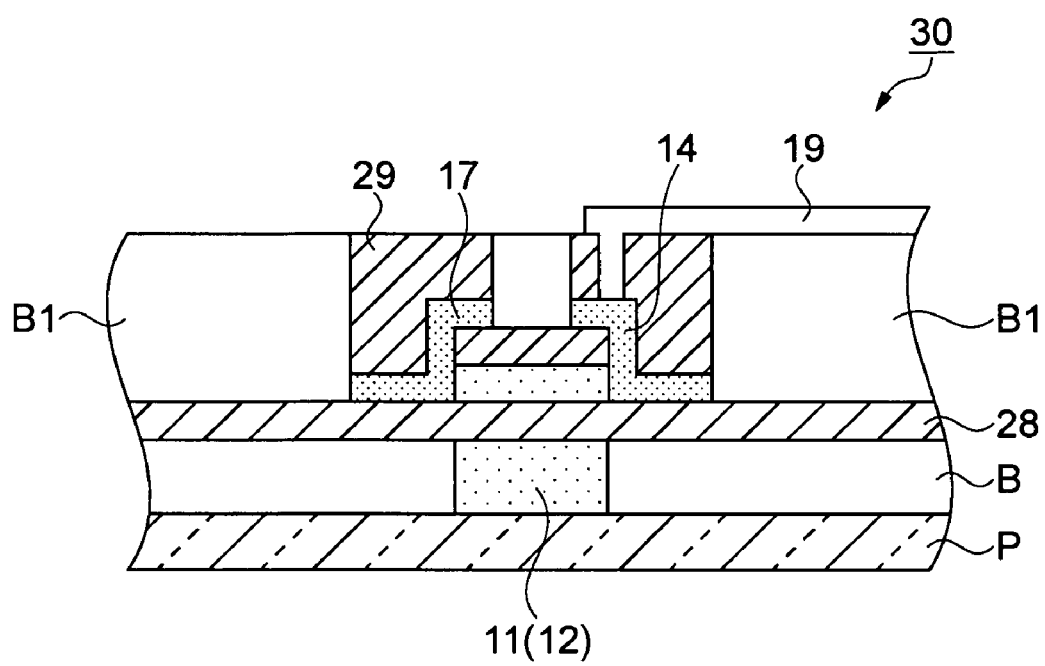
FIG. 4A is a sectional view of a TFT.
Figure 4B:
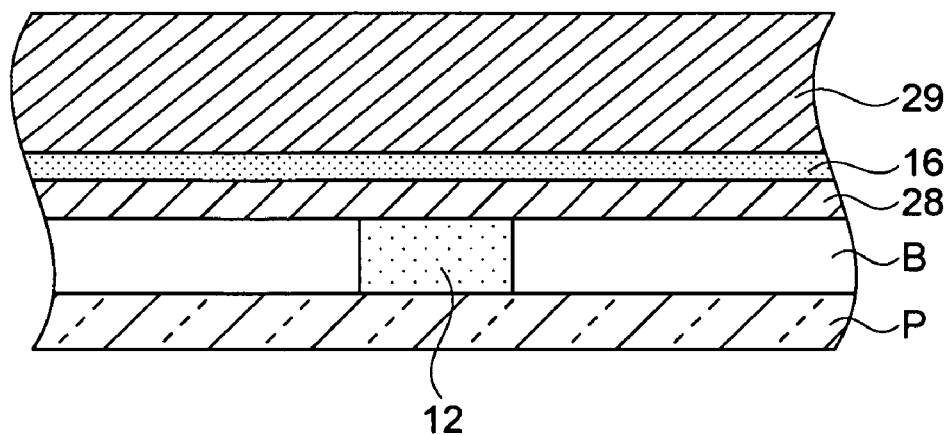
FIG. 4B is a sectional view of part of the TFT where gate wiring and source wiring intersect with each other on a plane.

A thin film transistor (TFT), which is an example of devices manufactured by using the method of for forming a wiring pattern according to the embodiment, will be described. FIG. 3 is a plan view showing the schematic structure of part of a TFT array substrate including one TFT. FIG. 4A is a sectional view of a TFT; FIG. 4B is a sectional view of part of the TFT where gate wiring and source wiring intersect with each other on a plane.

As shown in FIG. 3, gate wiring 12, source wiring 16, a drain electrode 14, and a pixel electrode 19 electrically connected to the drain electrode 14 are disposed on a TFT array substrate 10 with a TFT 30. The gate wiring 12 is formed to extend in the X-axis direction, and part of it is formed to extend in the Y-axis direction. Part of the gate wiring 12 extending in the Y-axis direction is used as a gate electrode 11. Additionally, the width of the gate electrode 11 is less than the width of the gate wiring 12. The gate wiring 12 is formed by the method for forming a wiring pattern of the embodiment. The source wiring 16 formed to extend in the Y-axis direction has a wide part, which is used as a source electrode 17.

As shown in FIGS. 4A and 4B, the gate wiring 12 is formed between banks B disposed on the substrate P. The gate wiring 12 and banks B are covered with an insulating film 28, and the source wiring 16, the source electrode 17, the drain electrode 14, and banks B1 are formed on the insulating film 28. The gate wiring 12 is insulated from the source wiring 16 by the insulating film 28, and the gate electrode 11 is insulated from the source electrode 17 and the drain electrode 14 by the insulating film 28. The source wiring 16, the source electrode 17, and the drain electrode 14 are covered with an insulating film 29.

Figure 5:
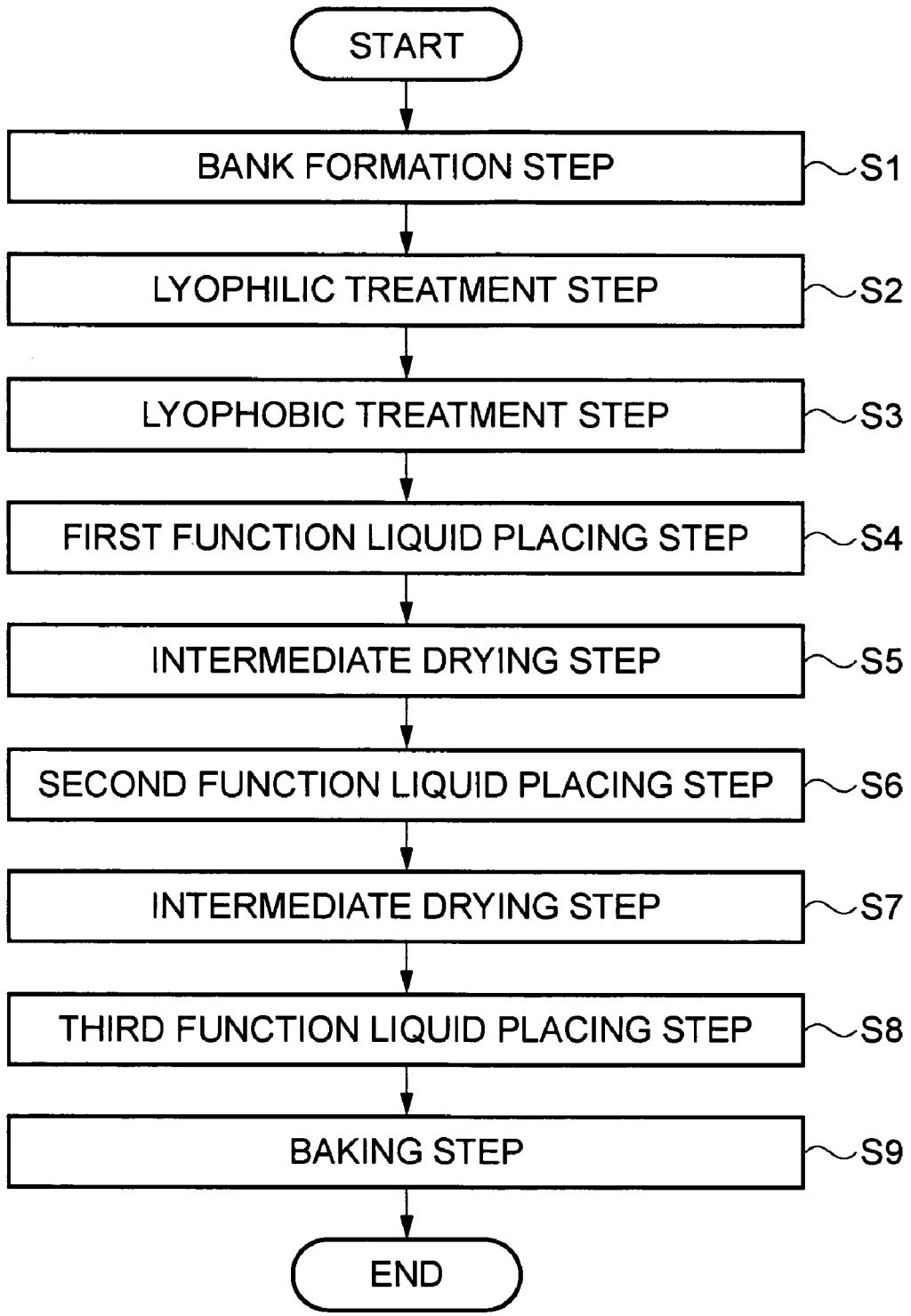
FIG. 5 is a flow chart showing a method for forming a wiring pattern.

A wiring pattern formation method of this embodiment will next be described. FIG. 5 is a flow chart showing an exemplary method for forming a wiring pattern according to the embodiment. FIGS. 6A to 6E and FIGS. 7F to 7J are sectional views showing manufacturing steps in the procedures of forming a bank.

The wiring pattern formation method according to the embodiment includes placing a wiring pattern functional liquid X mentioned above onto a substrate and forming a wiring film on the substrate so as to form a wiring pattern 79.

As shown in FIG. 5, step S1 is a bank formation step of providing a bank B in a protruding state so that a recess in accordance with the shape of the wiring pattern 79 is formed on the substrate P; step S2 is a lyophilic treatment step of imparting lyophilicity to the substrate P; and step S3 is a lyophobic treatment step of imparting lyophobicity to the bank B. The subsequent step S4 is a first functional liquid placing step of placing a wiring pattern functional liquid X1 to form a substrate film 71 as a first layer wiring pattern between banks to which lyophobicity is imparted. Step S5 is an intermediate drying step of drying the first functional liquid to remove a dispersion medium. Step S6 is a second functional liquid placing step of placing a wiring pattern functional liquid X2 to form the conducting film 73 as a second layer wiring pattern on the first layer wiring pattern. Step S7 is an intermediate drying step of drying the second functional liquid to remove a dispersion medium. Step S8 is a third functional liquid placing step of placing a wiring pattern functional liquid X3 to form a diffusion barrier film 77 as a third wiring pattern on the second layer wiring pattern. The final step S9 is a baking step of collectively baking the wiring pattern 79 that includes these substrate film 71, conducting film 73, and diffusion barrier film 77.

Figure 6A:
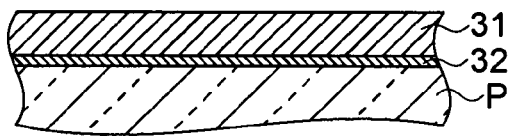
FIGS. 6A to 7J are sectional views showing manufacturing steps in the procedures of forming a bank.

Description will now be given in detail for each step. In the embodiment, a glass substrate is used as the substrate P. The bank formation step in step S1 will be described initially. As shown in FIG. 6A, in the bank formation step, a HMDS treatment is applied to the substrate P as a treatment to modify the surface before a material to form the bank B is applied. The HMDS treatment is a method of applying vaporized hexamethyldisilazane (($CH_3$)$_3$SiNHSi($CH_3$)$_3$). Thus, a HMIS layer 32 as an adhesion layer to improve adhesion between banks B and the substrate P is formed on the substrate P.

The banks B are members that serve as partitions. The formation of banks B can be performed by an arbitrary method such as a photolithography method or a printing method. If the photolithography method is used, for example, a material for forming banks B 31 is applied onto the HMDS layer 32 of the substrate P up to the height of the banks B by means of a predetermined method such as spin coating, spray coating, roll coating, die coating, or dip coating, and a resist layer is applied onto the material. Then, a mask is applied in the shape of banks B (in the shape of a wiring pattern), and the resist is exposed and developed, so that the resist in the shape of the banks B is left. Finally, the material for forming banks B in the area other than the masked area is removed by etching.

Figure 6B:
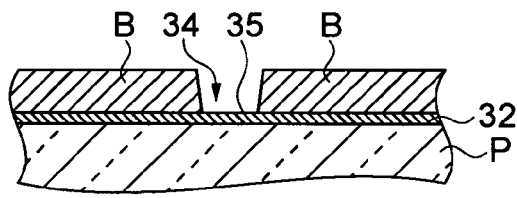
Figure 6C:
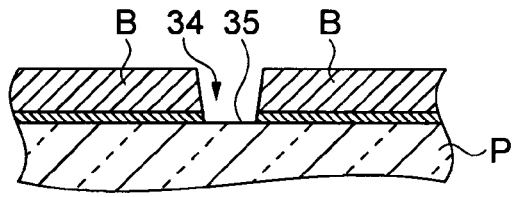

As shown in FIG. 6B, the banks B are disposed in a protruding state to surround the periphery of the region in which a wiring pattern it to be formed. Additionally, it is desirable that the banks B thus formed have a taper-like shape with a narrow width at the upper side and a wide width at the bottom side, because such a shape helps for a droplet of the functional liquid to flow into a groove between banks B as described later.

In the method for forming a wiring pattern of the embodiment, an inorganic material is used as the material for forming the banks B. As the method for forming the banks B by using an inorganic material, for example, a layer made of inorganic material is formed on the substrate P by using various types of coating or chemical vapor deposition method (CVD method), the layer is then patterned by etching, ashing, or the like, and the banks B in a predetermined shape can thereby be obtained. In addition, the banks B may be formed on a substance other than the substrate P and placed on the substrate P.

The material for forming the banks B may be a material that exhibits to be lyophobic to a functional liquid, or an insulating organic material that can be made lyophobic by plasma treatment fluorinated) and is easy to be patterned by photolithography due to its good adhesion to the underlying substrate, as described later. Examples of the material for forming inorganic banks B include, for example, a spin-on-glass film containing any one of silica glass, alkylsiloxane polymer alkylsilsesquioxane polymer, alkylsilsesquioxane-hydride polymer, and polyallylether, a diamond film, and a fluorinated amorphous carbon film. Furthermore, aerogel, porous silica, or the like, for example, may be used as the material for forming inorganic banks B.

An organic material may be used as the material for forming banks B. The organic material for forming banks B may be a material that exhibits to be lyophobic to a functional liquid, or an insulating organic material that can be made lyophobic by plasma treatment (fluorinated) and is easy to be patterned by photolithography due to its good adhesion to the underlying substrate, as described later. For example, it is possible to use a high-polymer material such as acrylic resin, polyimide resin, olefin resin, phenol resin, or melamine resin. A material that has an organic group containing an inorganic framework (siloxane bond) in its main chain may be used.

When the banks B are formed on the substrate P, hydrofluoric acid treatment is applied. The hydrofluoric acid treatment removes the HMDS layer 32 between banks B by etching with a 2.5% hydrofluoric acid solution, for example. In the hydrofluoric acid treatment, the banks B serve as masks, and the HMDS layer 32, which is an inorganic substance placed in a bottom 35 of the groove 34 formed between the banks B, is removed to expose the substrate P.

The lyophilic treatment step in step S2 will be described. In the lyophilic treatment step, lyophilic treatment of imparting lyophilicity to the bottom 35 between the banks B (exposed part of the substrate P9) is performed. As the lyophilic treatment step, ultraviolet (UV) radiation treatment of applying an ultraviolet light beam, $O_2$ plasma treatment using oxygen in air atmosphere, or the like can be selected. In the embodiment, $O_2$ plasma treatment is performed.

$O_2$ plasma treatment applies oxygen in a plasma state to the substrate P from a plasma discharge electrode. As an example of conditions for the $O_2$ plasma treatment, the plasma power is 50 to 1000 W; the oxygen gas flow rate is 50 to 100 mL/min; the relative movement speed of the substrate P to a plasma discharge electrode is 0.5 to 10 mm/sec; and the substrate temperature is 70 to 90 degrees Celsius.

If the substrate P is a glass substrate, its surface is lyophilic to the wiring pattern functional liquid X. Performing $O_2$ plasma treatment or ultraviolet radiation treatment as in the embodiment can further enhance the lyophilicity of the surface of the substrate P exposed between the banks B (the bottom 35). It is preferable that $O_2$ plasma treatment or ultraviolet radiation treatment be performed so that a contact angle to the functional liquid at the bottom 35 between banks B is equal to or less than 15 degrees.

Figure 9:
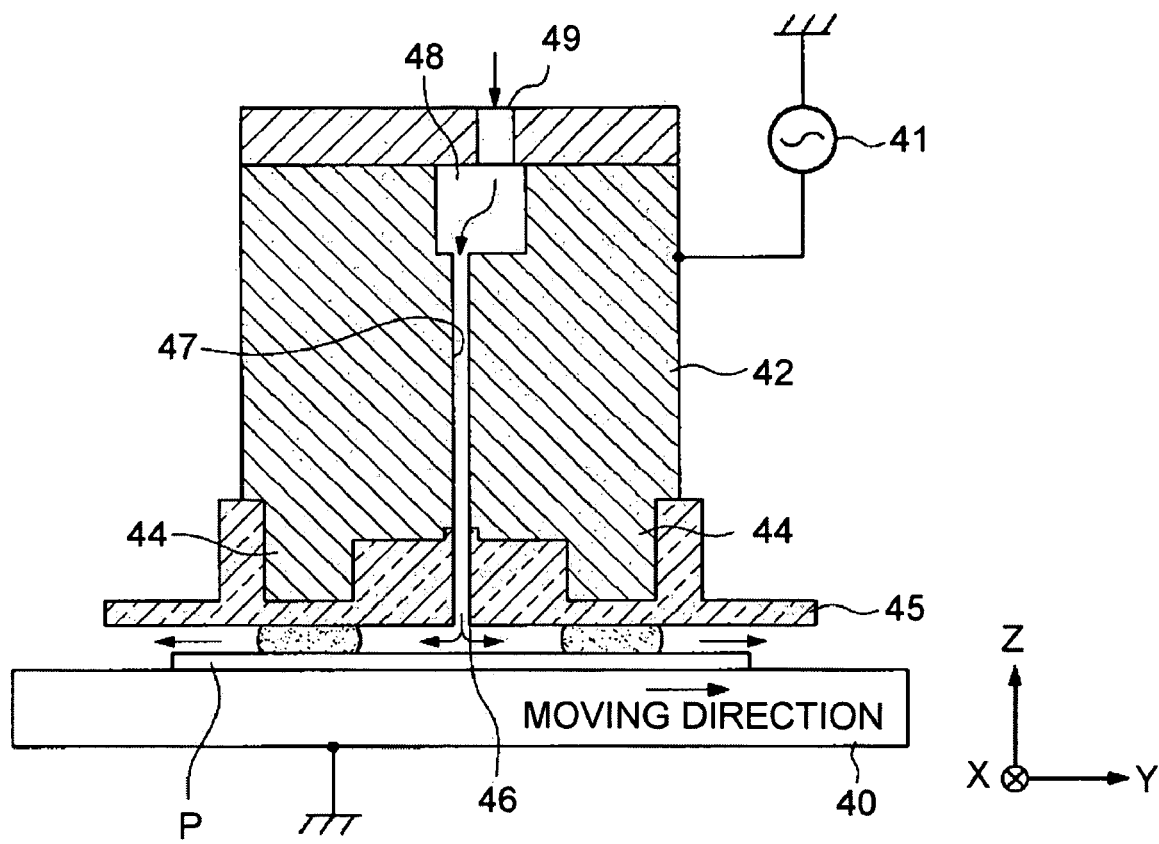
FIG. 9 is a schematic structure view of a plasma treatment device.

FIG. 9 is a schematic structure view of an exemplary plasma treatment device used in performing $O_2$ plasma treatment. The plasma treatment device shown in FIG. 9 includes an electrode 42 connected to an alternating current power supply 41 and a sample table 40, which is a ground electrode. The sample table 40 is movable in the Y-axis direction, while supporting the substrate P as a sample. Two parallel discharging portions 44 extending in the X-axis direction orthogonal to the moving direction are disposed in a protruding state on the undersurface of the electrode 42, and a dielectric material member 45 is disposed to surround the discharging portions 44. The dielectric material member 45 prevents abnormal discharging of the discharging portions 44. The undersurface of the electrode 42 including the dielectric material member 45 is substantially planar so that a tiny space (discharge gap) is formed between the discharging portions as well as dielectric material member 45 and the substrate P. A gas exhaust hole 46 constituting part of treated gas supply portion that is long and thin in the X-axis direction is disposed in the center of the electrode 42. The gas exhaust hole 46 is connected through the gas passage 47 and intermediate chamber 48 disposed inside the electrode to a gas inlet hole 49.

A predetermined gas containing a gas for treatment erupting through the gas passage 47 from the gas exhaust hole 46 is separated to flow backward and forward in the moving direction (Y-axis direction) in the space mentioned above and exhausted to the outside from the front and back ends. At the same time, a predetermined voltage is applied from the alternating current power supply 41 to the electrode 42, so that a gaseous discharge occurs between the discharging portions 44 and the sample table 40. Excited active species of the predetermined gas are generated by the plasma produced by this gaseous discharge to successively treat the entire surface of the substrate P passing through the discharged area.

In the embodiment, the predetermined gas is a mixture of oxygen ($O_2$) as a gas for treatment, a noble gas such as helium (He) or argon (Ar), which easily starts the electric discharge under a pressure near atmospheric pressure and keeps it stably, an inactive gas such as nitrogen ($N_2$) In particular, the residue of an organic substance (resist or HMDS) in forming the bank B at the bottom 35 between the banks B can be removed by using oxygen as a gas for treatment. Namely, the HMDS (organic substance) at the bottom 35 between the banks B may not be removed completely by fluoric acid treatment. Alternatively, the resist (organic substance) in forming the bank B may be left between the banks B. The residue at the bottom 35 between the banks B is removed by $O_2$ plasma treatment.

Although the description that hydrofluoric acid treatment should be performed to remove the KMDS layer 32 has been given for the embodiment, hydrofluoric acid treatment need not be performed because the HMDS layer 32 at the bottom 35 between the banks B can be removed sufficiently by $O_2$ plasma treatment or ultraviolet radiation treatment. It has also been described for the embodiment that either $O_2$ plasma treatment or ultraviolet radiation treatment should be performed as the lyophilic treatment, but it will be understood that $O_2$ plasma treatment and ultraviolet radiation treatment may be combined.

The lyophobic treatment step in step S3 will then be described. In the lyophobic treatment step, the lyophobic treatment is performed for the bank B to impart lyophobicity to the surface. As the lyophobic treatment, plasma treatment using carbon tetrafluoride (tetrafluoromethane) ($CF_4$ plasma treatment) as a gas for treatment is employed. The conditions of $CF_4$ plasma treatment are as follows: for example, the plasma power is 50 to 1000 W; the carbon tetrafluoride gas flow rate is 50 to 100 ml/min; the relative delivery speed of the base to a plasma discharge electrode is 0.5 to 20 mm/sec; and the base temperature is 70 to 90 degrees Celsius. The gas for treatment is not restricted to tetrafluoromethane, and other fluorocarbon gases as well as gases such as SF6 and SF5CF3 may be used for treatment. For $CF_4$ plasma treatment, the plasma treatment device described with reference to FIG. 9 may be used.

By performing the lyophobic treatment as described above, a fluorine group is introduced to resin constituting the banks B, thereby imparting high lyophobicity to the banks B. The $O_2$ plasma treatment as lyophilic treatment mentioned above may be performed before forming the bank B. However, it is preferable to perform $O_2$ plasma treatment after forming the bank B, because the pretreatment by using $O_2$ plasma makes flurorination (being lyophobic) easy.

The exposed area of the substrate P disposed between the banks B, for which lyophilic treatment is performed in advance, is more or less affected by lyophobic treatment for the banks B. However, particularly in the case where the substrate P is made of glass or the like, a fluorine group is not introduced by lyophobic treatment, so that lyophilicity, that is, wettability of the substrate P is never impaired substantially.

By the lyophilic treatment step and the lyophobic treatment step mentioned above, the surface is modified so that lyophobicity of the bank B is higher than lyophobicity of the bottom 35 between the banks B. Additionally, $O_2$ plasma treatment is performed as a lyophilic treatment. As described above, however, if the substrate P is made of glass or the like, a fluorine group is not introduced by lyophobic treatment. Therefore, if only $CF_4$ plasma treatment is performed, instead of $O_2$ plasma treatment, lyophobicity of the bank B can be higher than lyophobicity of the bottom 35 between the banks B.

Figure 6D:
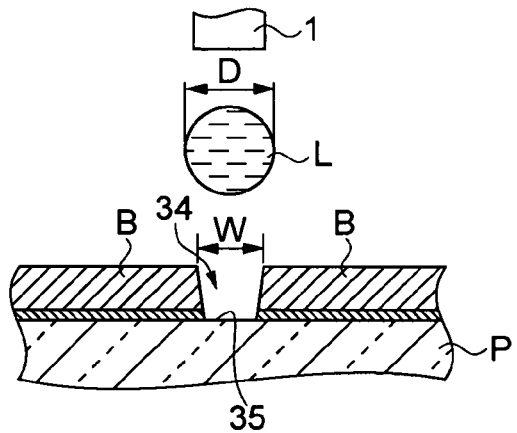

The first functional liquid placing step in step S4 will be described. In the first functional liquid placing step, the droplet L of the wring pattern functional liquid X1 is placed between the banks B on the substrate P by the droplet discharge technique using the droplet discharge device IJ mentioned above. As shown in FIG. 6D, in the first functional liquid placing step, the wiring pattern functional liquid X1 is discharged from the droplet discharge head 1. The droplet discharge head 1 discharges the wiring pattern functional liquid X1 towards the groove 34 between the banks B to place the wiring pattern functional liquid X1 in the groove 34. At this point, since the area for a wiring pattern to be formed (namely, the groove 34) to which the droplet L is discharged is surrounded by the banks B, the droplet L can be prevented from expanding beyond a predetermined position.

In the embodiment, the width W of the groove 34 between the banks B (the width in the opening of the groove 34 in this case) is nearly equal to the diameter D of the droplet L of a functional liquid. It is preferable that the atmosphere for discharging the droplet L be at a temperature equal to or less than 60 degrees Celsius at a humidity equal to or less than 80%. Thus, stable droplet discharge can be performed without clogging at the discharge nozzle 25 of the droplet discharge head 1.

If such the droplet L is discharged from the droplet discharge head 1 and placed inside the groove 34, part of the droplet L may be placed on the banks B as shown by a chain double-dashed line because the diameter D of the droplet L is nearly equal to the width W of the groove 34. However, since the surfaces of the banks B are lyophobic and have taper-like shapes, the droplet placed on the banks B is repelled from the banks B, and is further flown down to the inside of the groove 34 due to capillary phenomenon. Most of the wiring pattern functional liquid X1 thereby flows into the inside of the groove 34 as shown by a full line in FIG. 6E.

The wiring pattern functional liquid X that is discharged into the inside of the groove 34 or is flown down from the banks B is easily spread in a wet state, because lyophilic treatment is applied to the substrate P (bottom 35). Therefore, the wiring pattern functional liquid X fills in the inside of the groove 34 more uniformly.

Figure 6E:
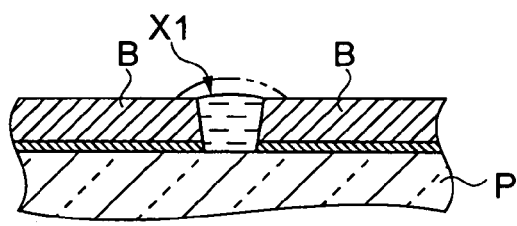

The wiring pattern functional liquid X1 is placed between the banks B on the substrate P as shown in FIG. 6E by using the droplet discharge technique with the droplet discharge device IJ mentioned above. Then the substrate film 71 is formed as shown in FIG. 7E The substrate film 71 is a thin film having lyophilicity to a wiring pattern functional liquid X1 disposed at the recess between the banks B. A wiring pattern functional liquid X1 to form the substrate film 71 uses manganese as a material for forming the substrate film 71 and diethylene glycol diethyl ether as a solvent (a dispersion medium).

Figure 7F:
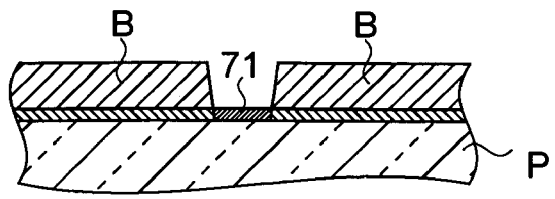

The intermediate drying step in step S5 will then be described. In the intermediate drying step, after a predetermined amount of wiring pattern functional liquid X1 is discharged onto the substrate P, drying is performed so as to remove a dispersion medium if necessary. The wiring pattern functional liquid X1 is solidified by this drying to the extent that it does not mix with other kinds of liquid disposed thereon, e.g., the wiring pattern functional liquid X2. The drying may be performed by lamp annealing other than the typical processing by use of a hot plate, an electric furnace, etc., to heat the substrate P There is no particular restriction on the light source used for lamp annealing; an infrared lamp, a xenon lamp, a YAG laser, an argon laser, a carbon dioxide gas laser, or an excimer laser of XeF, XeCl, XeBr, KrF, KrCl, ArF, ArCl, or the like may be used as the light source. The light sources having the output in the range not less than 10 W nor more than 5000 W are generally used, but the light sources having the output in the range not less than 100 W nor more than 1000 W are sufficient for the embodiment. By the intermediate drying step, the substrate film 71 made of the wiring pattern functional liquid X1 containing Mn as conductive fine particles is formed on the substrate P between the banks B, as shown in FIG. 7F The film thickness of the substrate film 71 formed is about 70 nm.

Figure 7G:
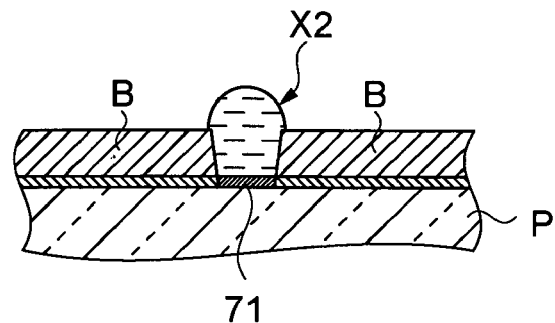
Figure 7H:
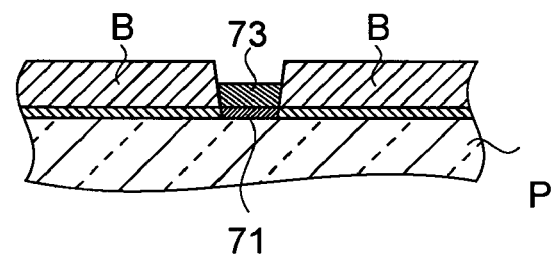

The second functional liquid placing step in step S6 will be described. In the second functional liquid placing step, the wiring pattern functional liquid X2 is placed between the banks B on the substrate P, as shown in FIG. 7G, by the droplet discharge technique using the droplet discharge device IJ. The conducting film 73 is formed as shown in FIG. 7H. The conducting film 73 is a thin film having conductivity. Additionally, the wiring pattern functional liquid X2 for forming the conducting film 73 uses an organic silver compound as a material to form the conducting film 73, which is a conductive material, and diethylene glycol diethyl ether as a solvent.

The intermediate drying step in step S7 will be described. In the intermediate drying step, the second functional liquid is prebaked, the same as in step S5 described above. By the intermediate drying step, the conducting film 73 made of the wiring pattern functional liquid X2 containing Ag as conductive fine particles is formed on the substrate P between the banks B, as shown in FIG. 7H. The film thickness of the conducting film 73 formed is about 200 nm.

Figure 7I:
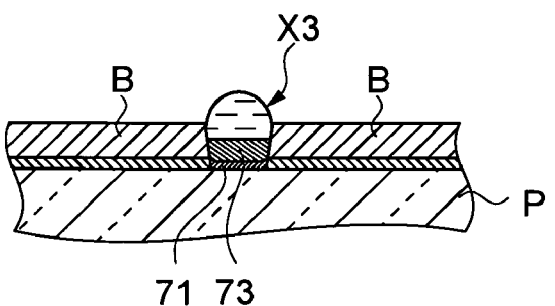
Figure 7J:
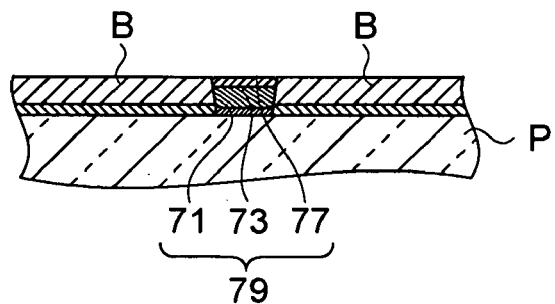

The third functional liquid placing step in step S8 will be described. In the third functional liquid placing step, the wiring pattern functional liquid X3 to form the diffusion barrier film 77 is placed on the wiring film. In the third functional liquid placing step, the wiring pattern functional liquid X3 is placed between the banks B on the substrate P, as shown in FIG. 7I, by the droplet discharge technique using the droplet discharge device IJ in the same way as in the first and second functional liquid placing steps. The diffusion barrier film 77 is formed as shown in FIG. 7J. The diffusion barrier film 77 is a thin film to prevent the diffusion of the conducting film 73. Additionally, the wiring pattern functional liquid X3 for forming the diffusion barrier film 77 uses nickel as a material to form the diffusion barrier film 77 and diethylene glycol diethyl ether as a solvent (dispersion medium).

The baking step in step S9 will be described. In the baking step, heat treatment is performed to remove a dispersion medium in the first, second, and third wiring pattern functional liquids X (X1, X2, and X3) and secure their film thicknesses. If coating using an organic substance or the like is applied onto the surface of metal fine particles so as to enhance the dispersibility, removing the coating material is also necessary. In particular, if the second wiring pattern functional liquid X2 is an organic silver compound, it is necessary to perform heat treatment to obtain the conductivity such that an organic component of the organic silver compound is removed and a silver particle remains. For this purpose, heat treatment and/or optical processing is applied to the substrate after the discharge step. At this point, heat treatment is applied simultaneously and collectively to the first, second, and third wiring pattern functional liquids X (X1, X2, and X3). As shown in FIG. 7J, a layered film in which three layers, that is, the substrate film 71, conducting film 73, and diffusion barrier film 77, are layered one atop another is formed. The film thickness of the diffusion barrier film 77 formed is about 500 nm.

Heat treatment and/or optical processing is normally performed in the atmosphere, and may be performed in an inert gas atmosphere such as nitrogen, argon, or helium, or reduction atmosphere such as hydrogen as the need arises. The treatment temperature of the heat treatment and/or optical processing is suitably set in consideration of the boiling point (steam pressure) of the dispersion medium, the type and pressure of an atmosphere gas, thermal behaviors such as dispersibility and oxidation of fine particles, the presence or absence and the quantity of a coating material, the upper temperature limit of a base material, etc. In the embodiment, baking is performed in a dean oven in the atmosphere at 280 to 300 degrees Celsius for 300 minutes for the functional liquid of which a pattern is formed. Additionally, to remove an organic component of the organic silver compound, it is necessary to bake at about 200 degrees Celsius. It is also preferable that if a substrate made of plastics is used, baking be performed at a temperature not less than the room temperature nor more than 250 degrees Celsius. By the steps described above, the electrical contact between fine particles is secured in a dry film after the discharge step, and the dry film is transformed to the conducting film 73.

In the first embodiment as described above, the following effects are obtained.

(1) Collectively baking the layered film can control the occurrence of a void caused by the difference in the hysteresis of heating, enabling the uniform growth of metal particles. The uniform growth of metal particles leads to forming a film with little unevenness. As a result, the wiring pattern 79 of a layered film obtained by forming the substrate film 71 as the first wiring pattern, the conducting film 73 as the second wiring pattern, and the diffusion barrier film 77 as the third wiring pattern can be a film with flatness.

(2) The wiring pattern 79 of a layered film has flatness, and therefore a device with a few quality problems such as a crack and a breakage can be provided.

(3) Collectively baking the layered film enables the baking step to be completed at one time. Operations can be simplified to be effective.

(4) The intermediate drying step (pre-baking) is placed after the functional liquid placing step, and therefore a dispersion medium in a wiring pattern functional liquid X can be removed in a positive manner. The next wiring pattern functional liquid X can be placed quickly to an area surrounded by the banks B, making the operations effective.

Second Embodiment

The second embodiment will be described. The second-embodiment differs from the first embodiment in having the lyophobic treatment step for imparting lyophobicity to the bank B after performing the intermediate drying for the functional liquid. Note that parts identical to those in the first embodiment or parts having functions equivalent to those of parts in the first embodiment are identified with the same reference numerals, and overlapping descriptions will not be repeated for the equivalent steps.

Figure 8:
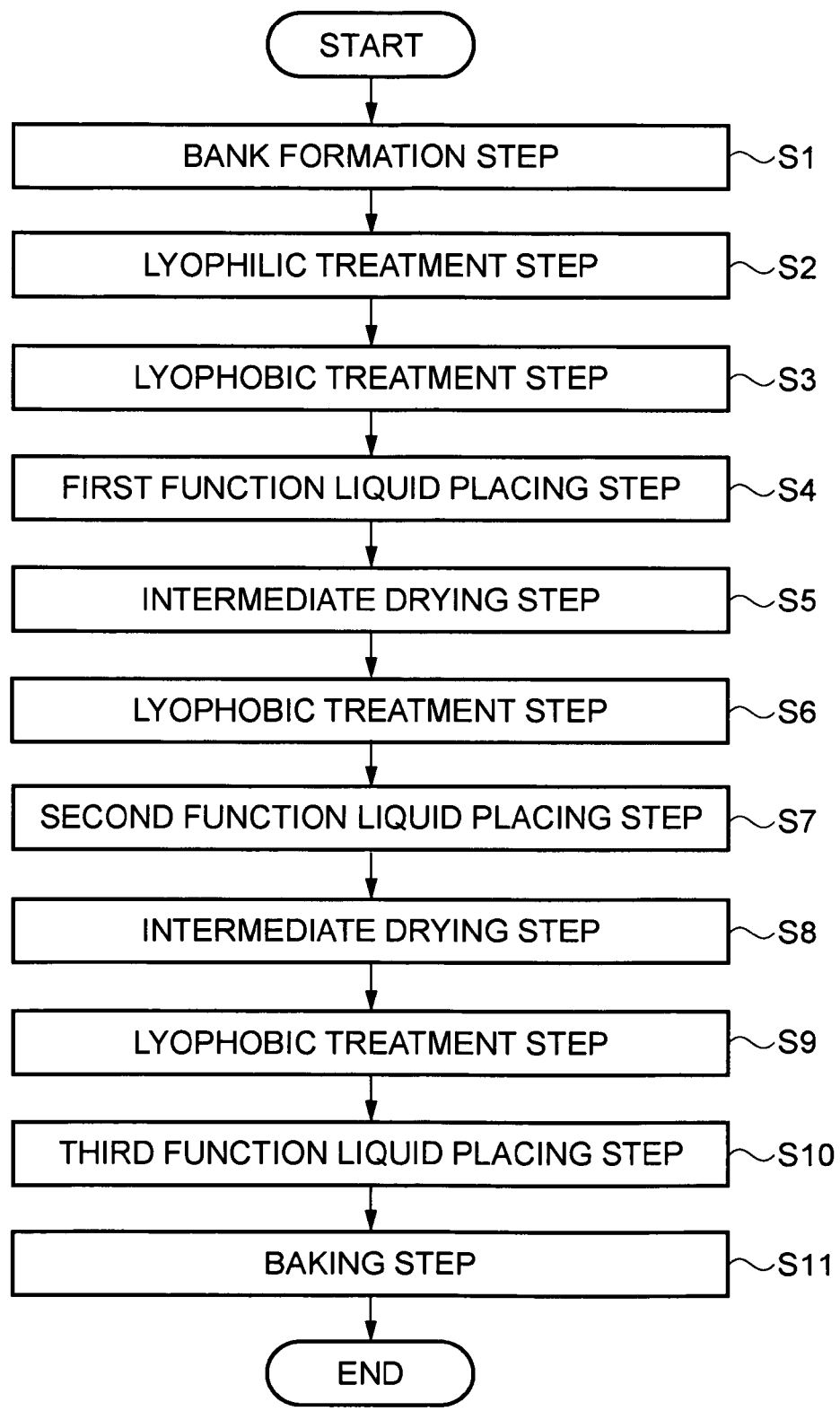
FIG. 8 is a flow chart showing a method for forming a wiring pattern of a second embodiment.

As shown in FIG. 8, the lyophobic treatment steps in steps S6 and S9 are added following the intermediate drying steps in steps S5 and S8. These lyophobic treatment steps in steps S6 and S9 are aimed at imparting lyophobicity to the bank B. Their conditions are the same as in step S3, and therefore the description will be omitted.

Lyophobic treatment is applied to the bank B, and therefore a fluorine group is introduced to resin constituting the bank B. High lyophobicity is thereby imparted to the bank B.

In the second embodiment as described above, the following effects other than the same effects as obtained in the first embodiment are obtained.

(5) The intermediate drying steps to remove a dispersion medium are placed after the first and second functional liquid placing steps such that when a dispersion medium contained in the wiring pattern functional liquid X is removed, the surface of the bank B is also dried similarly. Particularly, since the wiring pattern functional liquids X1 and X2 are placed, the surface is dried each time the functional liquid is placed (the surface is dried twice in this case). Lyophobicity of the surface of the bank B tends to decrease because the bank B is dried a plurality of times. In the embodiment, lyophobicity of the surface of the bank B can be restored to the original state by adding the lyophobic treatment step after the intermediate drying. If lyophobicity of the surface of the bank B can be restored to the original state, the wiring pattern functional liquid X, particularly the wiring pattern functional liquid X2 or X3, is repelled by the bank B to be easily contained in an area surrounded by the bank B even if the wiring pattern functional liquid X larger than the area surrounded by the bank B lands in the area in writing a pattern. Accordingly, the wiring pattern functional liquid X precisely fills the area surrounded by the bank B. As a result, the three layered wiring pattern 79 obtained by forming the substrate film 71 as the first wiring pattern, the conducting film 73 as the second wiring pattern, and the diffusion barrier film 77 as the third wiring pattern can be a flatter film.

Display Device (Electro-optic Apparatus) and Manufacturing Method Thereof

A liquid crystal display device 100, which is an example of the electro-optic apparatus according to an exemplary aspect of the invention, will be described. The liquid crystal display device 100 of the embodiment includes a TFT with circuit wiring formed by using the circuit wiring formation method described in the first embodiment.

Figure 10:
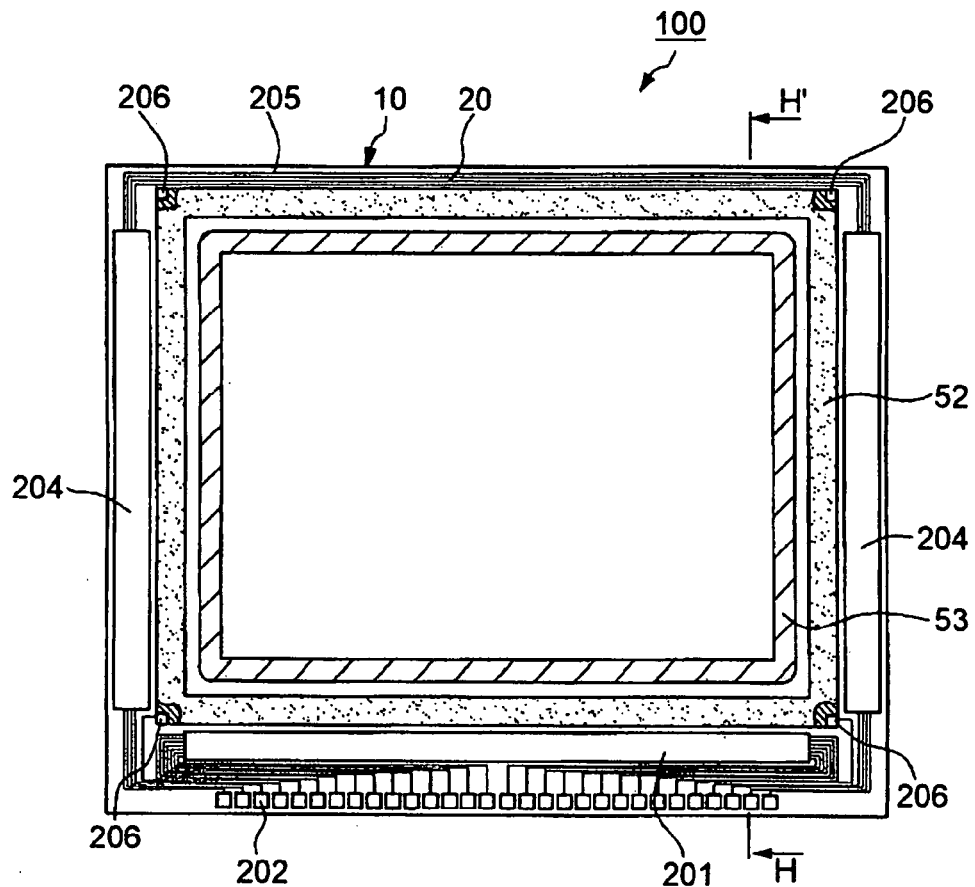
FIG. 10 is a plan view of a liquid crystal display seen from the counter substrate side.
Figure 11:
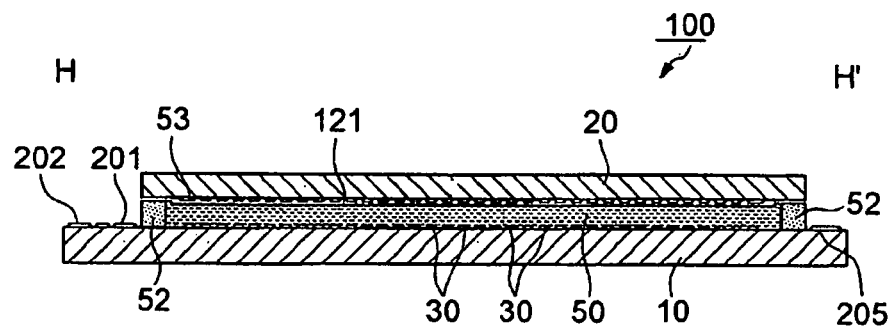
FIG. 11 is a sectional view taken along the line H-H' in FIG. 10.

FIG. 10 is a plan view showing the liquid crystal display device 100 according to the embodiment with its elements, seen from the counter substrate side. FIG. 11 is a sectional view taken along the line H-H' in FIG. 10.

As shown in FIGS. 10 and 11, in the liquid crystal display device (electro-optic apparatus) 100 of the embodiment, the TFT array substrate 10 and a counter substrate 20, forming a pair, are laminated with a seal material 52, which is a photocurable sealing material, and a liquid crystal 50 is sealed and held in the area zoned by this seal material 52. The seal material 52 is formed in a frame-like shape closed in the area of the substrate surface.

A peripheral break line 53 made of a shading material is formed in an area inside the area in which the seal material 52 is formed. In the area outside the seal material 52, the data line drive circuit 201 and a mounted terminal 202 are formed along one side of the TFT array substrate 10, and a scan line drive circuit 204 is formed along the two sides adjacent to the foregoing one side. Along the remaining one side of the TFT array substrate 10, wiring 205 consisting of a plurality of lines to connect the scan line drive circuits 204 placed at both sides of the image display region is disposed. An inter-substrate conducting material 206 for electric continuity between the TFT array substrate 10 and the counter substrate 20 is disposed in at least one position at the corner of the counter substrate 20.

Instead of forming the data line drive circuit 201 and the scan line drive circuit 204 on the TFT array substrate 10, a tape automated bonding (TAB) substrate on which an LSI for driving is mounted and a group of terminals formed in the periphery of the TFT array substrate 10 may be electrically and mechanically connected through an anisotropic conducting film. In the liquid crystal display device 100, a phase difference plate, a polarization plate, and the like, not shown, are placed in a prescribed direction depending on the type of the liquid crystal 50 used, that is, whether the operation mode is a twisted nematic (TN) mode or a super twisted nematic (STN) mode, etc., or depending on whether the mode is a normally white mode or a normally black mode. If the liquid crystal display device 100 is structured as an apparatus for color display, for example, red (R), green (G), and blue (B) color filters and their protective films are formed, on the counter substrate 20, in an area that is positioned opposite to pixel electrodes, described later, on the TFT array substrate 10.

Figure 12:
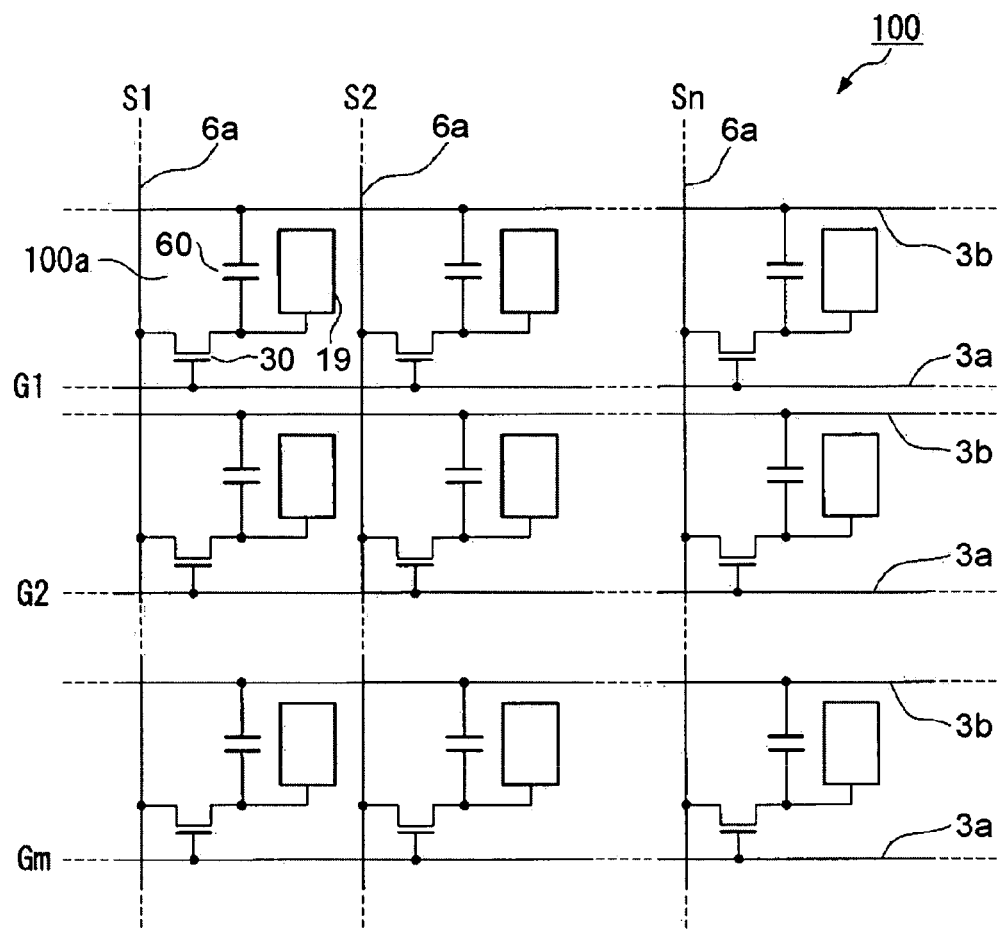
FIG. 12 is an equivalent circuit view of the liquid crystal display device.
Figure 13:
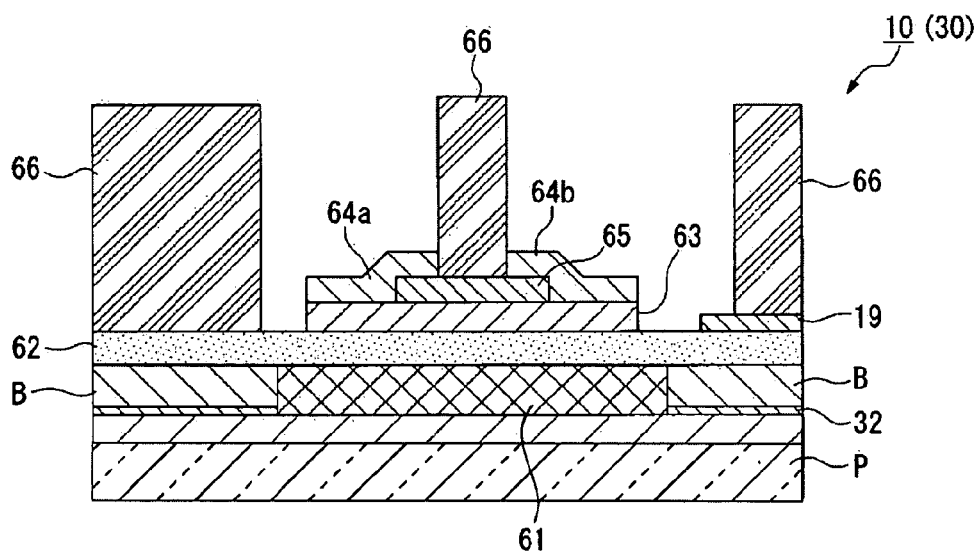
FIG. 13 is a partial enlarged sectional view of the liquid crystal display device.

FIG. 12 is an equivalent circuit view of various elements and wiring in a plurality of pixels formed in a matrix in the image display region of the liquid crystal display device 100. FIG. 13 is a partial enlarged sectional view of the liquid crystal display device 100. In the drawings referred to in the following description, layers and elements are drawn to unequal scales so as to be recognizable on the drawings.

As shown in FIG. 12, in the image display region of the liquid crystal display device 100 having such a structure, a plurality of pixels 100a are structured in a matrix, and a TFT for pixel switching (switching element) 30 is formed in each pixel. Data lines 6a that supply pixel signals S1, S2, . . . Sn are electrically connected to the source of the TFT 30. The pixel signals S1, S2, . . . Sn written to the data lines 6a may be supplied in this order to the lines, and may be supplied by group to a plurality of data lines 6a adjacent to each other. Scan lines 3a are electrically connected to the gate of the TFT 30 so that scan signals G1, G2, . . . Gm are intermittently applied in sequence in this order to the scan lines 3a with a predetermined timing.

As shown in FIG. 13, the pixel electrode 19 is electrically connected to the drain of the TFT 30, and the pixel signals S1, S2, . . . Sn supplied from the data lines 6a are written to pixels with a predetermined timing by keeping the TFT 30, which is a switching element, in an on condition for a certain period. The pixel signals S1, S2, . . . Sn, at a predetermined level written through the pixel electrode 19 to the liquid crystal are held on the way to a counter electrode 121 of the counter substrate 20 shown in FIG. 11 for a certain period. To prevent the held pixel signals S1, S2, . . . Sn to leak out, a storage capacitor 60 is added in parallel to a liquid crystal capacitor formed between the pixel electrode 19 and the counter electrode 121. For example, the voltage of the pixel electrode 19 is held in the storage capacitor 60 for a time three digits longer than the time of the application of a source voltage. Thus, retention properties of charge improve, and therefore the liquid crystal display device 100 with high contrast ratio can be attained.

FIG. 13 is a partial enlarged sectional view of the liquid crystal display device 100 having a bottom gate type TFT 30; on the glass substrate P constituting the TFT array substrate 10, gate wiring 61 is formed between the banks B, which are above the glass substrate P, by the circuit wiring formation method in the above embodiment.

A semiconductor layer 63, which is an amorphous silicon (a-Si) layer, is deposited above the gate wiring 61 with a gate insulating film 62 made of SiNx therebetween. Part of the semiconductor layer 63 facing this gate wiring part is regarded as a channel region. Junction layers 64a and 64b made of, for example, n+ type a-Si layers are deposited to obtain an ohmic junction on the semiconductor layer 63. An etch stop film 65 of insulation made of SiNx to protect the channel is formed on the part of the semiconductor layer 63 corresponding to the center portion of the channel region. These gate insulating film 62, semiconductor layer 63, and etch stop film 65 are patterned as shown in the drawing by the application of resist coating, photosensing, development, and photoetching after deposition (CVD).

Furthermore, the junction layers 64a and 64b and the pixel electrode 19 made of indium thin oxide (ITO) are formed as films in the same way, and patterned as shown in the drawing by the application of photoetching. Banks 66 are disposed in a protruding state on the pixel electrode 19, the gate insulating film 62, and the etch stop film 65, and a droplet of a silver compound is discharged to portions between the banks 66 by using the droplet discharge device IJ described above. A source line and a drain line can thereby be formed.

The TFT 30 is used as a switching element for driving the liquid crystal display device 100 in the above embodiment, and is also applicable for an organic electroluminescent (EL) display device, for example, other than the liquid crystal display device 100. The organic EL display device is an element having a structure in which a thin film containing a fluorescent inorganic or organic compound is sandwiched between the anode and the cathode. In the element, electrons and holes are injected to the foregoing thin film and recombine, thereby generating excitons. The element utilizes the emission of light (fluorescence and phosphorescence) during deactivation of the excitons to emit light. Materials expressing red, green, and blue luminescent colors among fluorescent materials used for the organic EL display element, namely, a material for forming a luminescent layer and materials for forming a hole injection layer and an electron transfer layer are used as functional liquids, and are subjected to patterning on the substrate having the TFT 30 mentioned above. A self-luminous full color EL device can thereby be manufactured. Such an organic EL device is included in the scope of an exemplary aspect of the invention.

Figure 14:
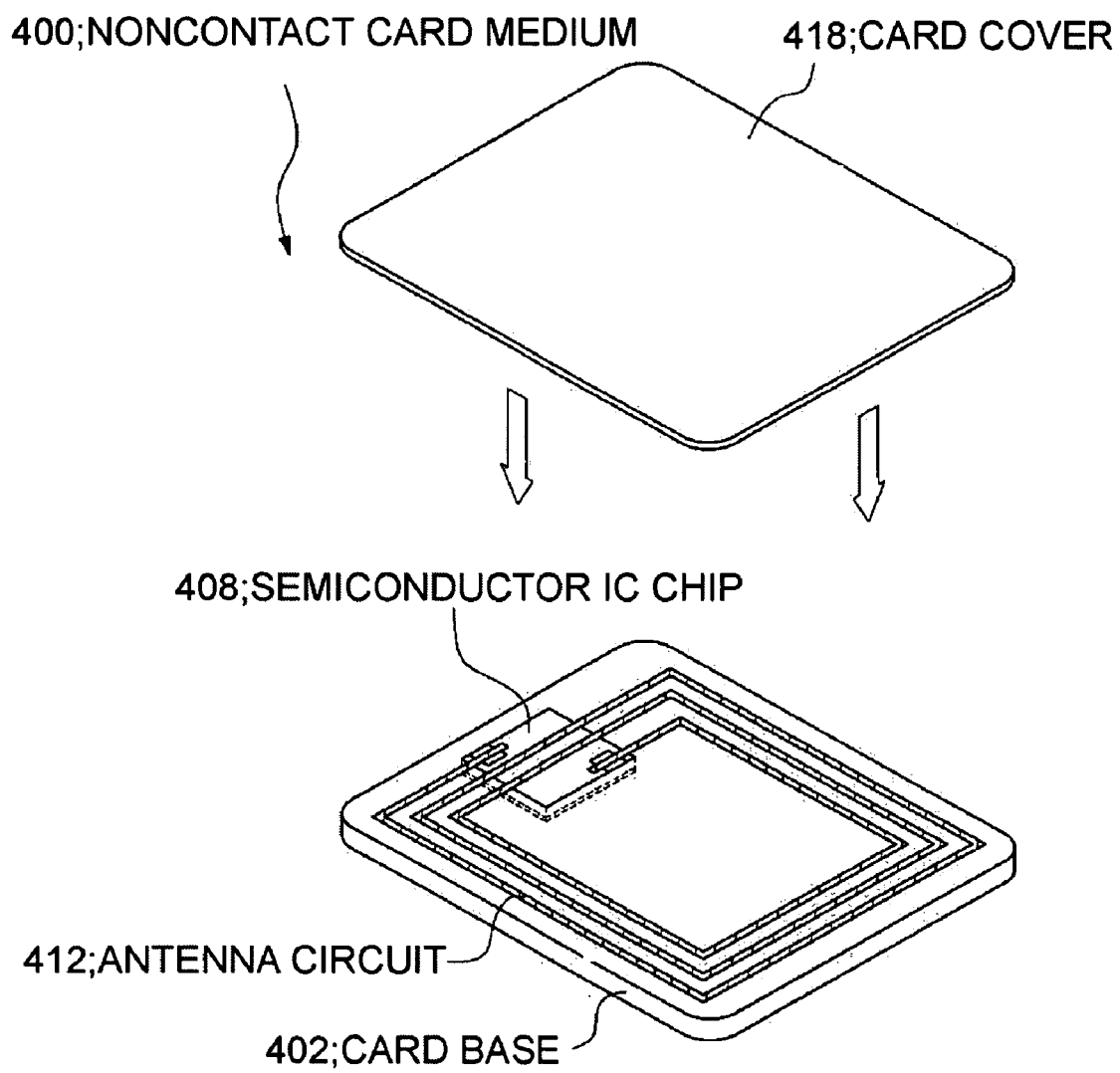
FIG. 14 is an exploded perspective view of a noncontact card medium.

FIG. 14 shows a noncontact card medium. A noncontact card medium (electronic equipment) 400 according to the embodiment has a semiconductor integrated circuits chip 408 and an antenna circuit 412 built-in in an enclosure consisting of a card base 402 and a card cover 418, so that at least one of power supply or giving and receiving data is carried out by an outside transmitting and receiving apparatus, not shown, and at least one of an electromagnetic wave or a electrostatic capacity coupling. In the embodiment, the antenna circuit 412 is formed by the foregoing wiring pattern formation method according to the embodiment.

In addition, a plasma display panel (PDP) and a surface conduction electron emitter that utilizes a phenomenon in which a current is applied to a thin film with a small area formed on a substrate in parallel to the surface of the film to emit an electron, other than the devices mentioned above may be mentioned as devices according to an exemplary aspect of the invention (electro-optic apparatus).

Electronic Equipment

Electronic equipment with a liquid crystal display device 100 according to an exemplary aspect of the invention will be described.

Figure 15:
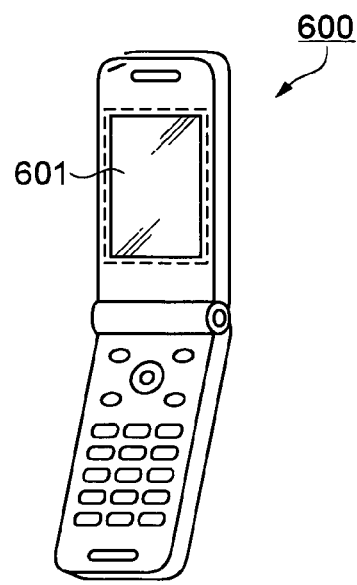
FIG. 15 is a perspective view of a cellular phone.

FIG. 15 is a perspective view of an exemplary cellular phone. In FIG. 15, a main body of a cellular phone 600 is shown, and a liquid crystal display unit 601 with a liquid crystal display device 100 of the above embodiment is shown.

Figure 16:
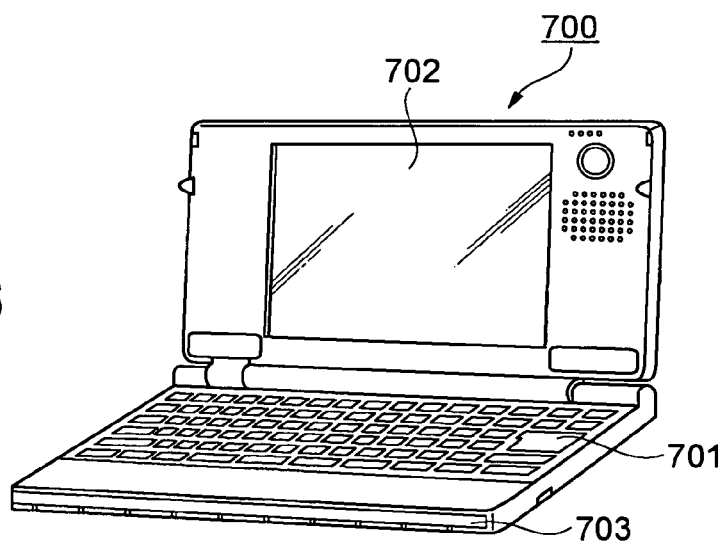
FIG. 16 is a perspective view of an information processing device.

FIG. 16 is a perspective view of an exemplary portable information processing device such as a word processor or a personal computer. In FIG. 16, an information processing device 700, an input unit 701 such as a keyboard, a main body of the information processing device 703, and a liquid crystal display unit 702 with a liquid crystal display device 100 of the above embodiment are shown.

Figure 17:
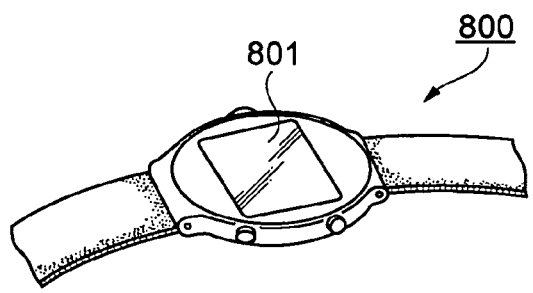
FIG. 17 is a perspective view of a wristwatch.

FIG. 17 is a perspective view showing exemplary wristwatch type electronic equipment. In FIG. 17, a main body of the wristwatch 800 is shown, and a liquid crystal display unit 801 with a liquid crystal display device 100 of the above embodiment is shown.

The electronic equipment shown in FIGS. 15, 16, and 17 with the liquid crystal display device 100 of the embodiment described above contains the wiring pattern 79 having a small step between the bank B and the circuit wiring film, a small protrusion of the circuit wiring film over the bank B, and a small residue of the conductive material on the peripheral bank B. The electronic equipment of the embodiment is structured to include a liquid crystal display device, and may be structured to include an organic electroluminescent display device, a plasma type display device or other electro-optic apparatus.

Thus, the invention has been described with respect to the preferred embodiments thereof, and it should be understood that the invention is not limited to the above embodiments and includes modifications as indicated below, which may be made in any other specific structures and forms within the scope of attaining the purpose of the invention.

Modification 1 In the first embodiment described above, the intermediate drying step is placed after the functional liquid placing step. This is, however, not restrictive. For example, the intermediate drying step may be omitted. In such a manner, the same effects as in the first and second embodiments can be obtained. Furthermore, the occurrence of a void between layers is made difficult because functional liquids are in a liquid state, and therefore the flatness of the layered film further improves. The intermediate drying step becomes unnecessary, and therefore the operations become effective.

Modification 2 In the second embodiment described above, the lyophobic treatment step is placed after the intermediate drying step such that lyophobicity is returned to the bank B and then the wiring pattern 79 is formed. This is, however, not restrictive. For example, the lyophilic treatment step may be placed after the intermediate drying step such that lyophilic treatment may be applied to the substrate film 71, the conducting film 73, and the diffusion barrier film 77 except for the bank B. In such a manner, the same effects as in the first and second embodiments can be obtained. Furthermore, lyophilicity of the layers of the substrate film 71, the conducting film 73, and the diffusion barrier film 77 improves. When the wiring pattern functional liquid X (X1, X2, and X3) is placed in an area surrounded by the bank B, the wiring pattern functional liquid X (X1, X2, and X3) can be easily stored in the area because lyophilicity of the layers has already improved.

Modification 3 In the first and second embodiments described above, the wiring pattern functional liquids X (X1, X2, and X3) are used and these three types wiring pattern functional liquids X are collectively baked to form the wiring pattern 79. This is, however, not restrictive. For example, four types wiring pattern functional liquids X may be used and collectively baked. In such a manner, a layered film of four layers can be formed. Additionally, if four types functional liquids cannot be collectively baked, two types wiring pattern functional liquids X are placed and collectively baked to form a layered film. Then, further two types wiring pattern functional liquids X are placed on the layered film and collectively baked. Thus, this way has the influence of the occurrence of a void between layers relatively less than in baking each layer, enabling the formation of a film with less unevenness. Namely, the wiring pattern 79 that constitutes a layered film consisting of four layers has the improved flatness. If still more types wiring pattern functional liquids X are used, a multi-layered film having flatness can be formed.

Modification 4 In the first embodiment described above, three types wiring pattern functional liquids X (X1, X2, and X3) are used to form the substrate film 71, the conducting film 73, and the diffusion barrier film 77. This is, however, not restrictive. For example, a layered structure in which the conducting film 73 has three layers by using the wiring pattern functional liquid X2 alone may be made (the formation of a layered film by using just one material). In such a manner, the same effects as in the first and second embodiments can be obtained. Furthermore, a layered film by using the conductive material alone can be made.

What is claimed is:

1. A method for forming a wiring pattern in a certain area on a substrate by using a droplet discharge technique, the method comprising:
    forming a bank surrounding the certain area on the substrate;
    discharging a first functional liquid containing a material of the wiring pattern to an area surrounded by the bank to form a first wiring pattern;
    discharging a second functional liquid onto the first wiring pattern to form a second wiring pattern; and
    collectively baking the wiring pattern of a plurality of layers including the first wiring pattern and the second wiring pattern.

2. A method for forming a wiring pattern in a certain area on a substrate by using a droplet discharge technique, the method comprising:
    forming a bank surrounding the certain area on the substrate;
    discharging a first functional liquid containing a material of the wiring pattern to an area surrounded by the bank to form a first wiring pattern;
    discharging a second functional liquid onto the first wiring pattern to form a second wiring pattern; and
    collectively baking the wiring pattern of a plurality of layers including the first wiring pattern and the second wiring pattern, wherein
    forming the first wiring pattern includes pre-baking the first wiring pattern after discharging the first functional liquid; and
    in forming the second wiring pattern, the second functional liquid is discharged onto the first wiring pattern pre-baked to form the second wiring pattern.

3. The method for forming a wiring pattern according to claim 2, wherein:
    the forming a second wiring pattern includes imparting lyophobicity to the bank before discharging the second functional liquid.

4. A method for forming a wiring pattern in a certain area on a substrate by using a droplet discharge technique, the method comprising:
    forming a bank surrounding the certain area on the substrate;
    discharging a first functional liquid containing a material of the wiring pattern to an area surrounded by the bank to form a first wiring pattern;
    discharging a second functional liquid onto the first wiring pattern to form a second wiring pattern;
    collectively baking the wiring pattern of a plurality of layers including the first wiring pattern and the second wiring pattern; and
    discharging a third functional liquid onto the second wiring pattern to form a third wiring pattern, after the forming a second wiring pattern and before the collectively baking,
    wherein in the collectively baking the wiring pattern of a plurality of layers, a substrate layer as the first wiring pattern, a conducting layer as the second wiring pattern, and a diffusion barrier layer as the third wiring pattern are collectively baked.

5. A method for manufacturing a device having a wiring pattern formed on a certain area on a substrate by using a droplet discharge technique, wherein:

the wiring pattern is formed on the substrate by using the method for forming a wiring pattern according to claim 1.

6. The method for manufacturing a device according to claim 5, wherein:

at least one of a gate electrode and gate wiring is formed as the wiring pattern on the substrate.

7. The method for manufacturing a device according to claim 5, wherein:

at least one of a source and source wiring is formed as the wiring pattern on the substrate.

* * * * *